(12) United States Patent
Lee

(10) Patent No.: US 10,381,057 B2
(45) Date of Patent: Aug. 13, 2019

(54) ADDRESS CONTROL CIRCUIT AND SEMICONDUCTOR DEVICE INCLUDING THE SAME

(71) Applicant: SK hynix Inc., Icheon-si, Gyeonggi-do (KR)

(72) Inventor: Byeong Cheol Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 29 days.

(21) Appl. No.: 15/854,169

(22) Filed: Dec. 26, 2017

(65) Prior Publication Data

US 2018/0374524 A1    Dec. 27, 2018

(30) Foreign Application Priority Data

Jun. 26, 2017    (KR) .................. 10-2017-0080529

(51) Int. Cl.

| | |
|---|---|
| *G11C 8/18* | (2006.01) |
| *G11C 29/00* | (2006.01) |
| *G11C 7/22* | (2006.01) |
| *G11C 8/06* | (2006.01) |
| *G11C 11/408* | (2006.01) |
| *G11C 16/20* | (2006.01) |
| *G11C 16/26* | (2006.01) |
| *G11C 8/12* | (2006.01) |
| *G11C 16/08* | (2006.01) |
| *G11C 29/18* | (2006.01) |
| *G11C 16/04* | (2006.01) |

(52) U.S. Cl.
CPC .................. *G11C 8/18* (2013.01); *G11C 7/22* (2013.01); *G11C 7/227* (2013.01); *G11C 8/06* (2013.01); *G11C 8/12* (2013.01); *G11C 11/408* (2013.01); *G11C 16/0483* (2013.01); *G11C 16/08* (2013.01); *G11C 16/20* (2013.01); *G11C 16/26* (2013.01); *G11C 29/18* (2013.01); *G11C 29/781* (2013.01); *G11C 29/842* (2013.01); *G11C 29/846* (2013.01)

(58) Field of Classification Search
None
See application file for complete search history.

(56) References Cited

U.S. PATENT DOCUMENTS

| | | | |
|---|---|---|---|
| 5,777,942 A * | 7/1998 | Dosaka ................. | G11C 11/005 365/189.05 |
| 6,067,260 A | 5/2000 | Ooishi et al. | |
| 6,078,543 A | 6/2000 | Kim | |
| 6,418,067 B1 | 7/2002 | Watanabe et al. | |
| (Continued) | | | |

FOREIGN PATENT DOCUMENTS

KR    100718038 B1    5/2007

*Primary Examiner* — Tuan T Nguyen
(74) *Attorney, Agent, or Firm* — William Park & Associates Ltd.

(57) ABSTRACT

An address control circuit may be provided. The address control circuit may include a first path circuit configured to generate a block select signal according to a control signal and an address signal. The address control circuit may include a second path circuit configured to generate, using the control signal, a dummy address signal making a transition at a timing substantially identical with a transition timing of the address signal, and generate, using the dummy address signal, an address latch signal for latching the block select signal.

10 Claims, 6 Drawing Sheets

(56) References Cited

U.S. PATENT DOCUMENTS

| | | |
|---|---|---|
| 6,498,756 B2 | 12/2002 | Lee |
| 2009/0207642 A1* | 8/2009 | Shimano ............... G11C 8/04 |
| | | 365/72 |
| 2016/0148656 A1* | 5/2016 | Kim ..................... G11C 8/06 |
| | | 365/51 |
| 2017/0084353 A1* | 3/2017 | Park .................... G11C 29/78 |
| 2017/0256326 A1 | 9/2017 | You |

* cited by examiner

US 10,381,057 B2

ADDRESS CONTROL CIRCUIT AND SEMICONDUCTOR DEVICE INCLUDING THE SAME

CROSS-REFERENCES TO RELATED APPLICATION

The present application claims priority under 35 U.S.C. § 119(a) to Korean application number 10-2017-0080529, filed on Jun. 26, 2017, in the Korean Intellectual Property Office, which is incorporated herein by reference in its entirety.

BACKGROUND

1. Technical Field

Various embodiments may generally relate to a semiconductor device, and, more particularly, to an address control circuit and a semiconductor apparatus including the same.

2. Related Art

A semiconductor apparatus may include a memory cell array, and the memory cell array may be divided into bank units (hereinafter, referred to as memory banks).

According to an address signal inputted from an external device, a block select signal for selecting a certain region (e.g., a MAT) of a memory bank selected from among a plurality of memory banks may be generated.

An address latch signal for latching the block select signal in a corresponding memory bank may be generated in response to a bank active signal according to a command combination.

Here, a source of the address latch signal is different from that of the block select signal, and a timing margin for a repair operation or the like should be secured.

Therefore, the address latch signal has no alternative but to generate a timing skew with respect to the block select signal, and the operation performance of the semiconductor apparatus may deteriorate due to this timing skew.

SUMMARY

In an embodiment, an address control circuit may be provided. The address control circuit may include a first path circuit configured to generate a block select signal according to a control signal and an address signal. The address control circuit may include a second path circuit configured to generate, using the control signal, a dummy address signal making a transition at a timing substantially identical with a transition timing of the address signal, and may generate, using the dummy address signal, an address latch signal for latching the block select signal.

In an embodiment, a semiconductor apparatus may be provided. The semiconductor apparatus may include a memory region including a plurality of memory banks. Each of the memory banks may be configured to receive a block select signal according to an address latch signal and may select a subunit memory block defined by the block select signal. The semiconductor apparatus may include a repair control circuit configured to perform a repair operation of selecting a redundant word line in lieu of a normal word line of the memory region when an internal address signal corresponds to an internally stored defect address. The semiconductor apparatus may include a command and address (command/address) processing circuit configured to receive and decode a command and an external address signal, generate signals pertaining to a normal operation and the repair operation, and provide the signals to the memory area and the repair control circuit. The semiconductor apparatus may be configured to generate the block select signal according to the external address signal, and may generate the address latch signal using a dummy address signal generated to make a transition at a timing substantially identical with a transition timing of the external address signal.

DETAILED DESCRIPTION

Hereinafter, embodiments of the present disclosure will be described with reference to the accompanying drawings.

Various embodiments may provide an address control circuit capable of minimizing a timing skew for controlling an address, and a semiconductor apparatus may include the address control circuit.

A memory system 100 in accordance with an embodiment may be embodied, e.g., in the form of a system-in-package structure, a multi-chip package structure, or a system-on-chip structure, or may be embodied in the form of a package-on-package structure including a plurality of packages.

Figure 1:
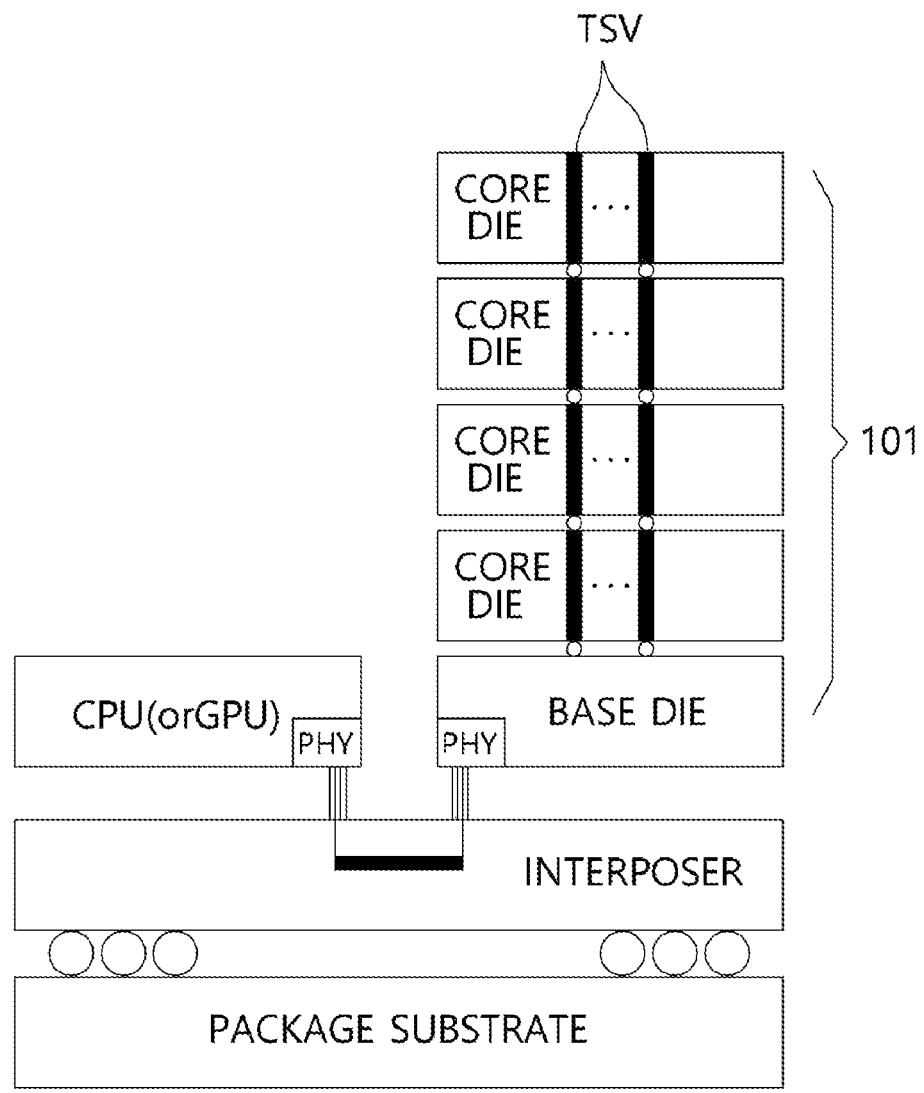
FIG. 1 is a diagram illustrating a configuration of a memory system in accordance with an embodiment.

Referring to FIG. 1, the memory system 100 in accordance with an embodiment may include a semiconductor memory 101, i.e., a stack-type semiconductor memory 101 formed by stacking a plurality of dies, a memory controller central processing unit CPU (or graphics processing unit GPU), an interposer, and a package substrate. In an embodiment, for example, a semiconductor apparatus may include a memory system 100. In an embodiment, for example, a semiconductor device may include a semiconductor apparatus.

The stack-type semiconductor memory 101 may be configured in the form of a high bandwidth memory (HBM) which is formed by stacking a plurality of dies and electrically coupling the dies with each other via through electrodes so that the number of input and output (input/output) units is increased, whereby the bandwidth thereof is increased.

The interposer may be coupled to an upper portion of the package substrate.

The stack-type semiconductor memory 101 and the memory controller CPU (or GPU) may be coupled to an upper portion of the interposer.

The stack-type semiconductor memory 101 and the memory controller CPU (or GPU) may respectively include physical regions (PHY) coupled to each other through the interposer.

The stack-type semiconductor memory 101 may include a plurality of dies, e.g., a base die and a plurality of core dies.

The base die and the plurality of core dies may be electrically coupled to each other through a plurality of through electrodes (e.g., a through silicon via (TSV)).

Figure 2:
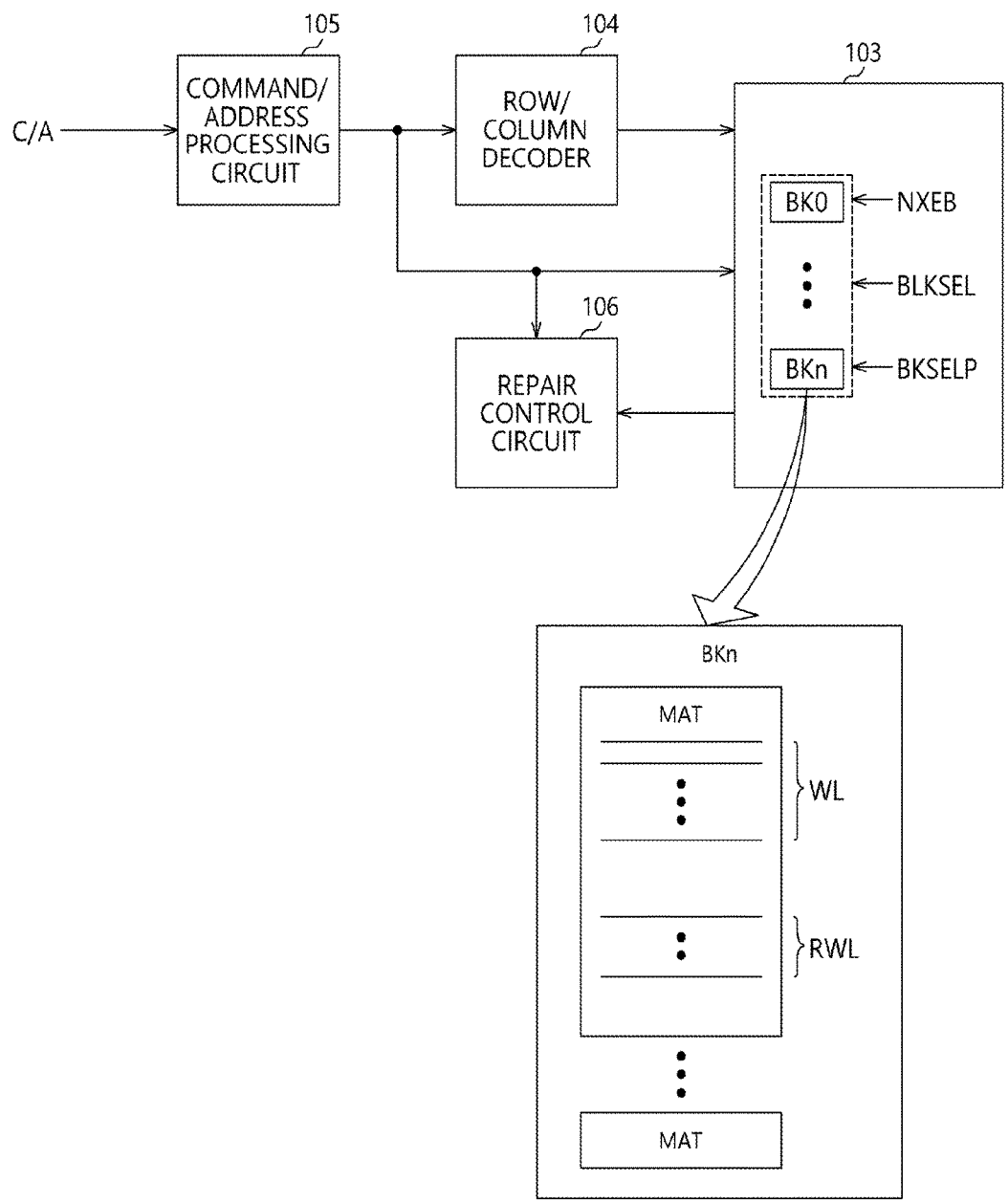
FIG. 2 is a diagram illustrating a configuration of any one semiconductor memory of a stack-type semiconductor memory of FIG. 1.

Referring to FIG. 2, any one, e.g., a core die 102, of the stack-type semiconductor memory 101 of FIG. 1 may include a memory region 103, a row and column (row/column) decoder 104, a command and address (command/address) processing circuit 105, and a repair control circuit 106.

The row/column decoder 104 may decode a row address and a column address and select a word line and a bit line of the memory region 103.

The command/address processing circuit 105 may receive a command/address signal C/A from an external device, decode the command/address signal C/A, and generate a command, such as a read command and write command (read command/write command), related to a normal operation, or signals related to a boot-up operation and a repair operation. In an embodiment, for example, the command/address processing circuit 105 may receive a command/address signal C/A including an external address signal from an external device. The command/address processing circuit 105 may provide a row address and a column address related to the normal operation and repair (operation/repair) operation, to the row/column decoder 104 or the repair control circuit 106.

The repair control circuit 106 may program, on an internal fuse array, a defect address detected before or after packaging, according to a command, e.g., a repair command, generated from the command/address processing circuit 105.

In the case where an address inputted from the external device corresponds to an internally stored defect address, the repair control circuit 106 may perform a repair operation of selecting a redundant word line in lieu of a normal word line of the memory region 103.

Furthermore, in the case where the address inputted form the external device corresponds to the internally stored defect address, the repair control circuit 106 may provide, to the memory region 103, a normal active block signal NXEB for preventing the normal word line of the memory region 103 from being enabled.

The fuse array in the repair control circuit 106 may store, on a fuse set basis, a defect address, i.e., an address corresponding to a memory cell determined as being defective among the memory cells of the memory region 103.

The fuse array in the repair control circuit 106 may be configured of an electronic fuse (e-fuse) capable of recording information through a program operation not only in a wafer state but also after the packaging.

The memory region 103 may include a plurality of memory banks BK0 to BKn. Each of the plurality of memory banks BK0 to BKn may include a plurality of subunit memory blocks, e.g., a mat. Each of the plurality of subunit memory blocks may include normal word lines, e.g., WL and redundant word lines, e.g., RWL.

Each of the plurality of memory banks BK0 to BKn may receive a block select signal in response to an address latch signal BLSELP and select a subunit memory block of the plurality of subunit memory blocks defined by the block select signal BLKSEL.

Each of the plurality of memory banks BK0 to BKn may prevent, in response to a normal active block signal NXEB, a currently selected normal word line from being enabled.

In the semiconductor memory 102 in accordance with an embodiment, the block select signal BLKSEL and the address latch signal BKSELP are generated through the same source and the same path so that a timing skew between the two signals can be minimized. This will be described with reference to FIGS. 3 to 5.

Figure 3:
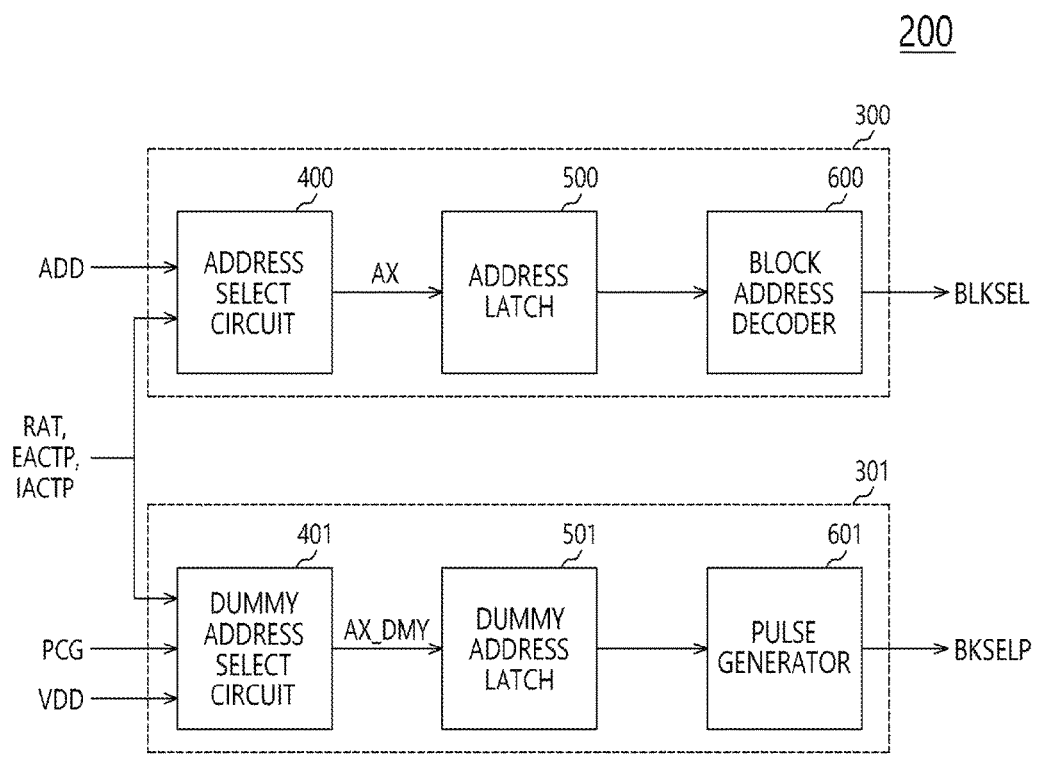
FIG. 3 is a diagram illustrating a configuration of an address control circuit in accordance with an embodiment.

Referring to FIG. 3, the address control circuit 200 in accordance with an embodiment may include a first path circuit 300 and a second path circuit 301.

The first path circuit 300 may be disposed over the command/address processing circuit 105, the repair control circuit 106, and the memory region 103.

The second path circuit 301 may be disposed in the same region as that of the first path circuit 300.

The first path circuit 300 may be a common term for circuit components corresponding to a path along which an address signal ADD passes to generate a block select signal BLKSEL.

The first path circuit 300 may generate the block select signal BLKSEL in response to a plurality of control signals EACTP, IACTP, and RAT and the address signal ADD.

Among the plurality of control signals EACTP, IACTP, and RAT, the control signal EACTP may be called an external active signal, the control signal IACTP may be called an internal active signal, and the control signal RAT may be called a refresh signal.

The first path circuit 300 may include an address select circuit 400, an address latch 500, and a block address decoder 600.

The address select circuit 400 may be included in the command/address processing circuit 105 of FIG. 2.

The address select circuit 400 may select an address signal ADD in response to a plurality of control signals EACTP, IACTP, and RAT and generate an internal address signal AX.

The address latch 500 may be included in the repair control circuit 106 of FIG. 2.

The address latch 500 may latch and output an internal address signal AX for the purpose of a repair operation of the repair control circuit 106.

The block address decoder 600 may be included in the memory region 103 of FIG. 2, e.g., in each of the plurality of memory banks BK0 to BKn.

The block address decoder 600 may decode an output of the address latch 500 and generate a block select signal BLKSEL.

The second path circuit 301 may include circuit components formed by replicating the internal circuit components of the first path circuit 300 so that the second path circuit 301 has the same propagation delay time as that of the first path circuit 300.

The second path circuit 301 may be a common term for circuit components which do not directly use an address signal ADD but correspond to a path along which a dummy address signal AX_DMY having the same transition timing as that of the address signal ADD passes to generate an address latch signal BKSELP.

The second path circuit 301 may generate an address latch signal BKSELP for latching the block select signal by making a transition of an output level at the same timing as the transition timing of the address signal ADD using a plurality of control signals EACTP, IACTP, and RAT.

The second path circuit 301 may include a dummy address select circuit 401, a dummy address latch 501, and a pulse generator 601.

The dummy address select circuit 401 may be included in the command/address processing circuit 105 of FIG. 2.

The dummy address select circuit 401 may have a circuit configuration formed by replicating the address select circuit 400.

The dummy address select circuit 401 may select a power supply voltage VDD in response to a plurality of control signals EACTP, IACTP, and RAT and a precharge signal PCG and generate a dummy address signal AX_DMY.

The dummy address latch 501 may be included in the repair control circuit 106 of FIG. 2.

The dummy address latch 501 may have a circuit configuration formed by replicating the address latch 500. The dummy address latch 501 may be configured to latch the dummy address signal AX_DMY.

The pulse generator 601 may be included in the memory region 103 of FIG. 2, e.g., in each of the plurality of memory banks BK0 to BKn.

The pulse generator 601 may be designed to have the same propagation delay time as that of the block address decoder 600 or designed such that delay time compensation is possible through a variation in delay time by a test mode signal, a register signal, a fuse set setting operation, or the like.

The pulse generator 601 may generate an address latch signal BKSELP in response to a transition of an output signal of the dummy address latch 501.

Figure 4:
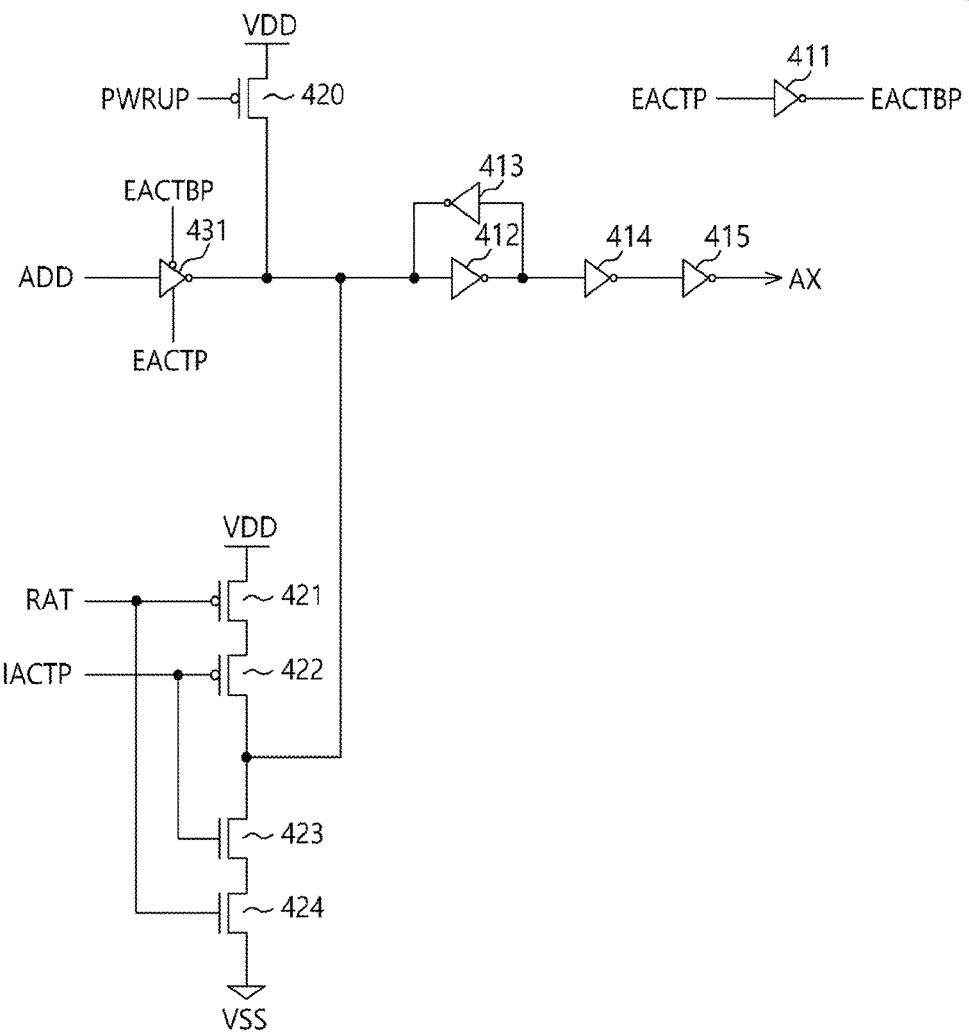
FIG. 4 is a diagram illustrating a configuration of an address select circuit of FIG. 3.

Referring to FIG. 4, the address select circuit 400 of FIG. 3 may include first to fifth inverters 411 to 415, first to fifth transistors 420 to 424, and a transmission gate 431.

The first inverter 411 may invert an external active signal EACTP and output it.

The transmission gate 431 may transmit an address signal ADD to the second inverter 412, during a normal active operation, i.e., when the external active signal EACTP is enabled to a high level.

The output of the second inverter 412 may be latched by the third inverter 413 and outputted as an internal address signal AX through the fourth and fifth inverters 414 and 415.

The first transistor 420 may initialize the internal address signal AX to an initial level, e.g., a low level, in response to a power-up signal PWRUP.

The second to fourth transistors 421 to 424 may enable the internal address signal AX using a ground voltage VSS, during a refresh operation, i.e., when the refresh signal RAT is enabled to a high level after the internal active signal IACTP has been enabled to a high level.

The second to fourth transistors 421 to 424 may initialize the internal address signal AX to a low level using the power supply voltage VDD when both the internal active signal IACTP and the refresh signal RAT are disabled to a low level.

Figure 5:
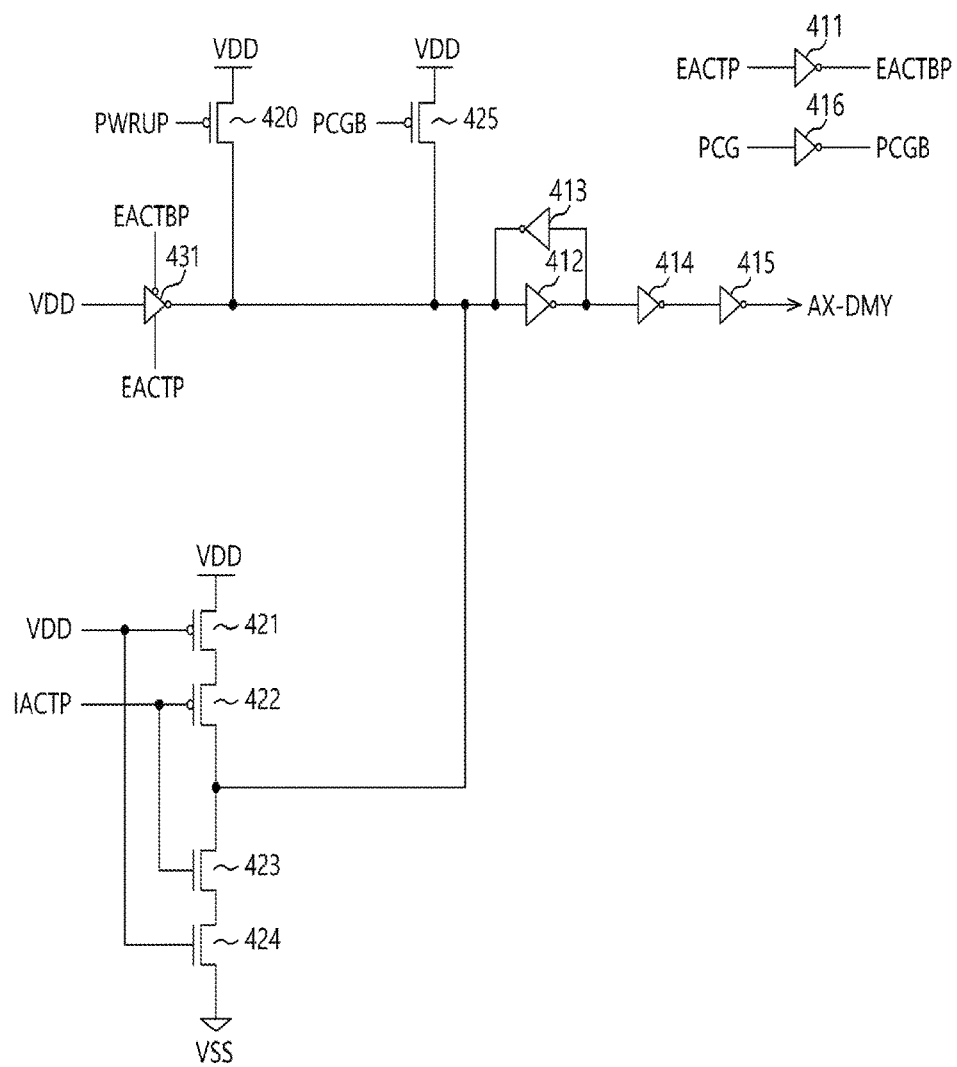
FIG. 5 is a diagram illustrating a configuration of a dummy address select circuit of FIG. 3.

Referring to FIG. 5, the dummy address select circuit 401 of FIG. 3 may be configured in the same manner as that of the address select circuit 400, except that a sixth transistor 425 and a sixth inverter 416 are added, the power supply voltage VDD in lieu of the address signal ADD is applied to the transmission gate 431, and the power supply voltage VDD is applied to a gate of the second transistor 421.

The sixth inverter 416 may invert a precharge signal PCG and output it.

The sixth transistor 425 may initialize a dummy address signal AX_DMY to a low level when the precharge signal PCG is enabled to a high level.

The transmission gate 431 may enable, during a normal active operation, the dummy address signal AX_DMY to a high level using the level of the power supply voltage VDD when the external active signal EACTP is enabled to a high level.

The second to fourth transistors 421 to 424 may enable the dummy address signal AX_DMY to a high level using the ground voltage VSS, regardless of the refresh operation, when the internal active signal IACTP is enabled to a high level.

Here, the power supply voltage VDD rather than the refresh signal RAT (refer to FIG. 4) is applied to the gate of the second transistor 421. Hence, the dummy address select circuit 401 may enable the dummy address signal AX_DMY to a high level in response to the internal active signal IACTP regardless of the refresh operation.

As described above, an embodiment of the present disclosure may be designed such that the second path circuit 301 has the same source, i.e., the same signal generation start timing and the same propagation delay time, as that of the first path circuit 300 along which the address signal ADD passes.

Figure 6:
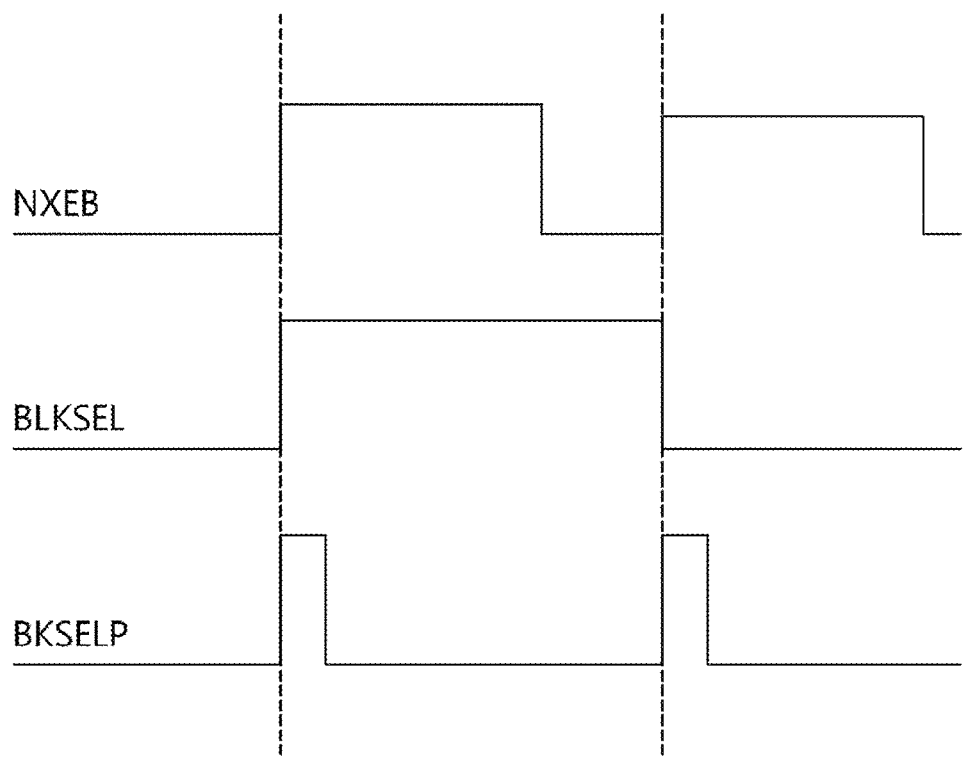
FIG. 6 is a diagram illustrating a timing of an address latch signal in accordance with an embodiment.

Referring to FIG. 6, the address latch signal BKSELP may be generated at the same timing as that of the block select signal BLKSEL, so that there is no need to take into account a margin of the address latch signal BKSELP for performing an operation corresponding to the normal active block signal NXEB.

Therefore, a tRCD (row address strobe (RAS) to column address strobe (CAS) Delay) that is a standard pertaining to the operation of the semiconductor apparatus may be improved, and the semiconductor apparatus may be operated regardless of tRRD (Row active to Row active Delay).

While various embodiments have been described above, it will be understood to those skilled in the art that the embodiments described are examples only. Accordingly, the data storage device and the operating method thereof described herein should not be limited based on the described embodiments.

What is claimed is:
1. An address control circuit comprising:
a first path circuit configured to generate a block select signal according to a control signal and an address signal; and
a second path circuit configured to generate, using the control signal, a dummy address signal making a transition at a timing substantially identical with a transition timing of the address signal, and generate, using the dummy address signal, an address latch signal for latching the block select signal.
2. The address control circuit according to claim 1, wherein the control signal includes at least one of an external active signal, an internal active signal, and a refresh signal.
3. The address control circuit according to claim 1, wherein the first path circuit comprises:
an address select circuit configured to select the address signal according to the control signal and generate an internal address signal;
an address latch configured to latch the internal address signal; and
a block address decoder configured to decode an output of the address latch and generate the block select signal.
4. The address control circuit according to claim 1, wherein the second path circuit is configured to have a propagation delay time substantially identical with a propagation delay time of the first path circuit.
5. The address control circuit according to claim 1, wherein the second path circuit includes a circuit configuration formed by replicating an internal circuit configuration of the first path circuit.

6. The address control circuit according to claim 1, wherein the second path circuit is disposed in the same region as that of the first path circuit.

7. The address control circuit according to claim 1, wherein the first path includes circuit components corresponding to a path along which the address signal passes to generate the block select signal.

8. The address control circuit according to claim 1, wherein the second path includes circuit components corresponding to a path along which the dummy address signal having substantially the same transition timing as that of the address signal passes to generate the address latch signal.

9. The address control circuit according to claim 3, wherein the second path circuit comprises:
- a dummy address select circuit configured by replicating the address select circuit, and configured to generate the dummy address signal using a power supply voltage according to the control signal;
- a dummy address latch configured by replicating the address latch, and configured to latch the dummy address signal; and
- a pulse generator configured to generate the address latch signal in response to a transition of an output signal of the dummy address latch.

10. The address control circuit according to claim 9, wherein the pulse generator is designed to have a propagation delay time substantially identical with a propagation delay time of the block address decoder or designed such that delay time compensation is possible through a variation in delay time.

* * * * *